US012756385B2

(12) United States Patent
Nakagawa

(10) Patent No.: US 12,756,385 B2
(45) Date of Patent: Oct. 6, 2026

(54) DRIVER CIRCUIT WITH TEMPERATURE DETECTION CIRCUIT

(71) Applicant: FUJI ELECTRIC CO., LTD., Kawasaki (JP)

(72) Inventor: Sho Nakagawa, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 242 days.

(21) Appl. No.: 18/779,878

(22) Filed: Jul. 22, 2024

(65) Prior Publication Data

US 2025/0096790 A1 Mar. 20, 2025

(30) Foreign Application Priority Data

Sep. 15, 2023 (JP) ................................ 2023-149805

(51) Int. Cl.
*H03K 17/0812* (2006.01)
*H03K 17/08* (2006.01)

(52) U.S. Cl.
CPC .................. *H03K 17/08122* (2013.01); *H03K 2017/0806* (2013.01)

(58) Field of Classification Search
CPC ................. H03K 17/08122; H03K 2017/0806
See application file for complete search history.

(56) References Cited

U.S. PATENT DOCUMENTS

| | | | | |
|---|---|---|---|---|
| 10,003,249 | B2 * | 6/2018 | Momota | H02M 1/08 |
| 2012/0146782 | A1 * | 6/2012 | Komatsu | H03K 17/18 340/653 |
| 2012/0242376 | A1 * | 9/2012 | Ose | H03K 17/0828 327/109 |
| 2016/0365852 | A1 | 12/2016 | Iwamizu et al. | |
| 2019/0140630 | A1 * | 5/2019 | Chen | H03K 17/08104 |
| 2020/0403397 | A1 * | 12/2020 | Nakagawa | G01K 3/005 |
| 2023/0327659 | A1 * | 10/2023 | Akahane | H03K 17/145 |
| 2025/0150071 | A1 * | 5/2025 | Akahane | H03K 17/08128 |

FOREIGN PATENT DOCUMENTS

JP 2017-005862 A 1/2017

* cited by examiner

*Primary Examiner* — Monica Lewis
*Assistant Examiner* — Nicolas Bellido
(74) *Attorney, Agent, or Firm* — Rabin & Berdo. P. C.

(57) ABSTRACT

A driver circuit which has a switching device having a control electrode, a power supply side electrode, and a ground side electrode; a current detection circuit configured to detect a drive current flowing through the switching device; and a control circuit configured to set a voltage level of the control electrode to a first level, so that when a current value of the drive current exceeds a predetermined value, the drive current continues to flow but the current value of the drive current decreases, wherein the control circuit changes the voltage level of the control electrode from the first level to a second level so that when a period during which the current value of the drive current exceeds the predetermined value reaches a predetermined period, the drive current continues to flow but the current value of the drive current further decreases.

10 Claims, 9 Drawing Sheets

DRIVER CIRCUIT WITH TEMPERATURE DETECTION CIRCUIT

CROSS-REFERENCE TO RELATED APPLICATIONS

The present application claims priority pursuant to 35 U.S.C. § 119 from Japanese patent application number 2023-149805 filed on Sep. 15, 2023, the entire disclosure of which is hereby incorporated by reference herein.

BACKGROUND

Technical Field

The present disclosure relates to a driver circuit.

Description of the Related Art

For example, there is a driver circuit that controls a drive current flowing through a load and drives the load (for example, Japanese Patent Application Publication No. 2017-005862).

The driver circuit may include a temperature detection circuit that detects temperature, for example. Such a driver circuit stops driving the load when the temperature gets higher than a predetermined temperature, resulting in an overheated state, and resumes driving the load when the temperature drops below the predetermined temperature.

However, when the driving of the load is repeatedly stopped or resumed as the temperature rises or drops around the predetermined temperature, stress is applied to a switching device included in the driver circuit, leading to a concern that the switching device may be broken-down.

SUMMARY

A first aspect of an embodiment of the present disclosure to solve the above-mentioned problem is a driver circuit that comprises a switching device having a control electrode, a power supply side electrode, and a ground side electrode; a current detection circuit configured to detect a drive current flowing through the switching device; a temperature detection circuit configured to detect a temperature; and a control circuit configured to set a voltage level of the control electrode to a first level, so that when a current value of the drive current exceeds a predetermined value, the drive current continues to flow but the current value of the drive current decreases, wherein when the temperature exceeds a first temperature while the current value of the drive current exceeds the predetermined value, the control circuit changes the voltage level of the control electrode from the first level to a second level, so that the drive current continues to flow but the current value of the drive current further decreases.

A second aspect of an embodiment of the present disclosure to solve the above-mentioned problem is a driver circuit that comprises a switching device having a control electrode, a power supply side electrode, and a ground side electrode; a current detection circuit configured to detect a drive current flowing through the switching device; and a control circuit configured to set a voltage level of the control electrode to a first level, so that when a current value of the drive current exceeds a predetermined value, the drive current continues to flow but the current value of the drive current decreases, wherein the control circuit changes the voltage level of the control electrode from the first level to a second level so that when a period during which the current value of the drive current exceeds the predetermined value reaches a predetermined period, the drive current continues to flow but the current value of the drive current further decreases.

DETAILED DESCRIPTION

Figure 1:
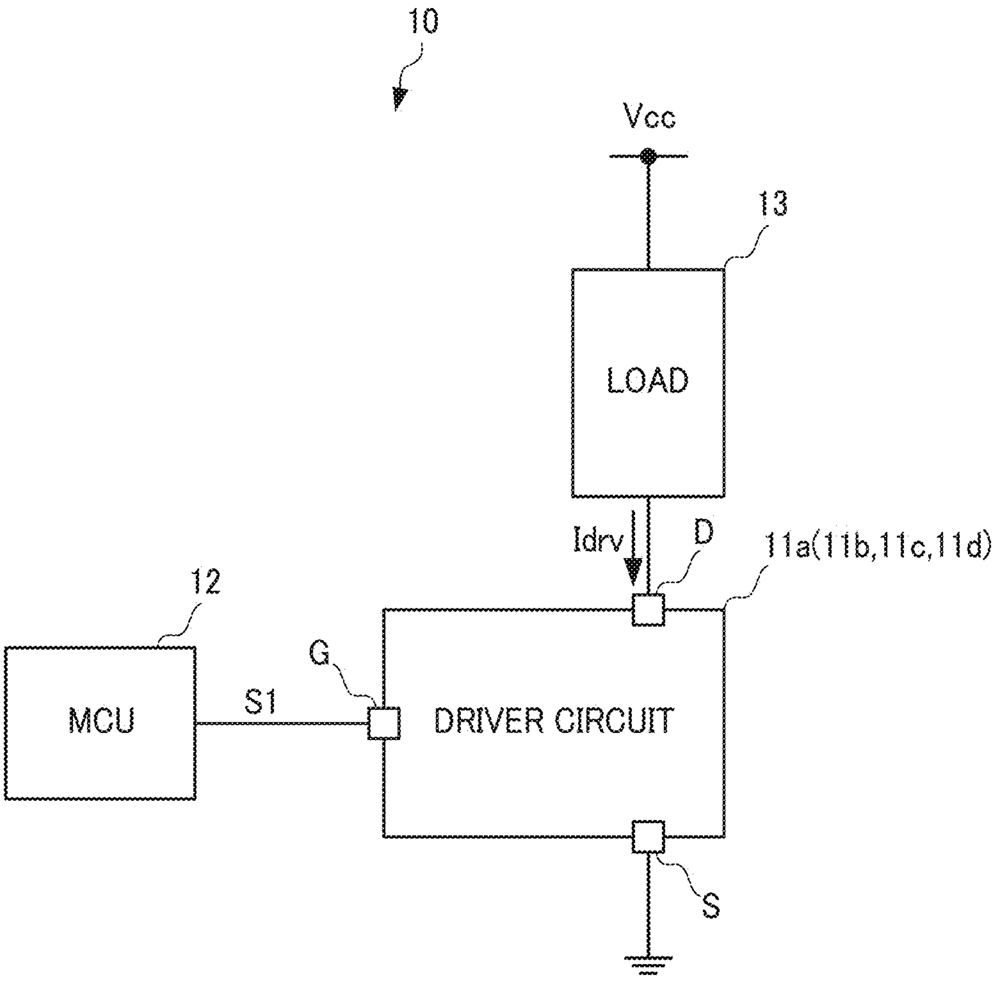
FIG. 1 is a diagram illustrating a configuration example of a motor control apparatus 10.

At least following matters will become apparent from the present description and the accompanying drawings. The following describes a preferred embodiment of the present disclosure with reference to the drawings. The same or equivalent components, members, and the like illustrated in the drawings are given by the same reference numerals, and a description thereof is omitted as appropriate.

Embodiment

<<<Overview of Motor Control Apparatus 10>>>

FIG. 1 is a diagram illustrating a configuration of a motor control apparatus 10 according to an embodiment of the present disclosure. The motor control apparatus 10 includes a driver circuit 11*a* and a microcomputer (MCU) 12. The driver circuit 11*a* controls a load 13, which is a motor provided in an automobile, based on a signal S1 from the microcomputer 12. Specifically, the driver circuit 11*a* controls, for example, a drive current Idrv flowing through the load 13 that is the motor, based on the signal S1. Note that a power supply voltage Vcc (for example, 13 V) from a power supply (not illustrated) is applied to the load 13.

The driver circuit 11*a* is a semiconductor module having a control terminal G to which the signal S1 is inputted, a power supply side terminal D coupled to the power supply via the load 13, and a ground side terminal S coupled to the ground. Note that the power supply side terminal D corresponds to a "first terminal" and the ground side terminal S corresponds to a "second terminal".

The microcomputer 12 outputs the signal S1 based on an instruction (not illustrated) inputted from outside and controls the driver circuit 11*a*.

<<<Configuration of Driver Circuit 11*a*>>>

Figure 2:
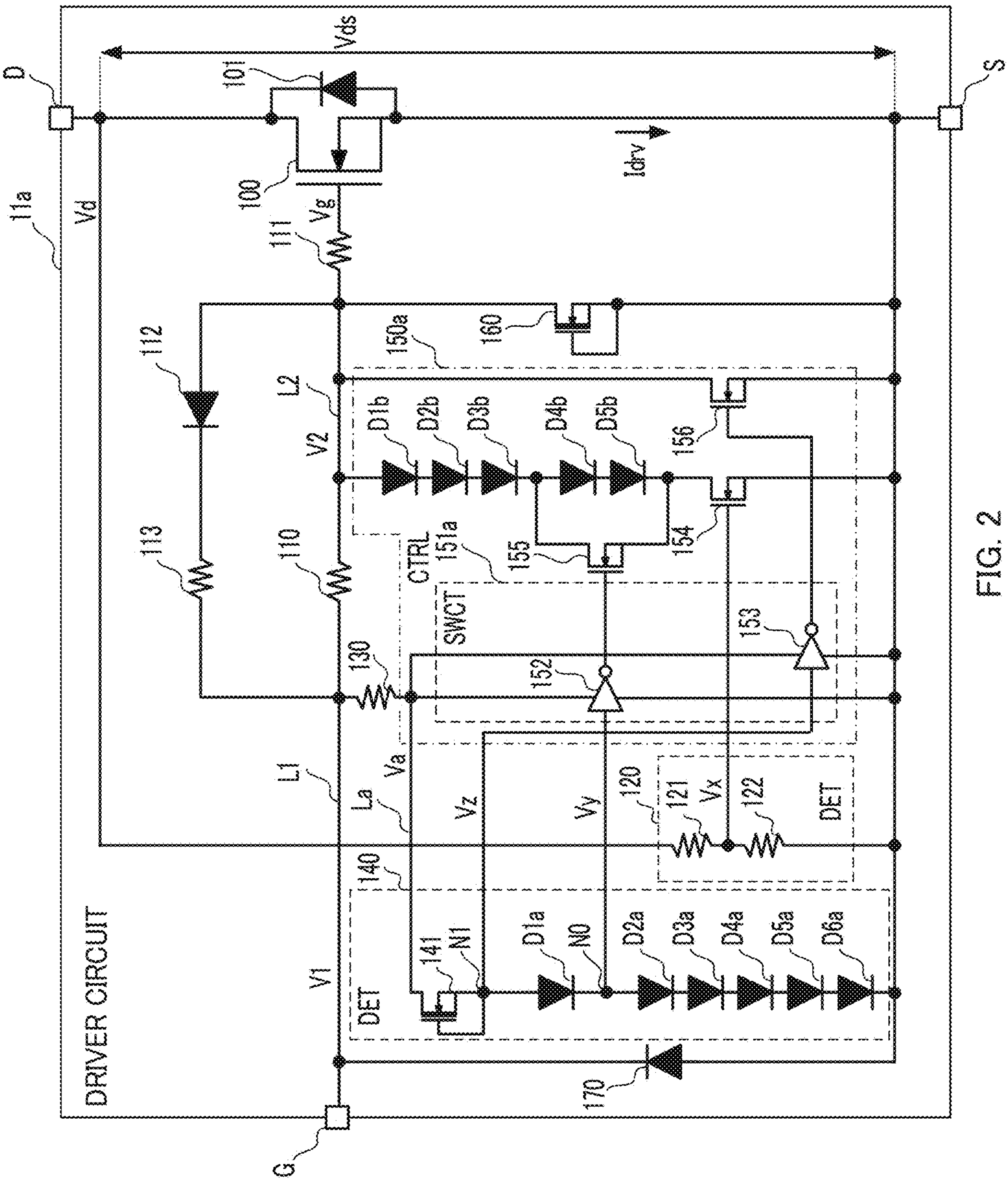
FIG. 2 is a diagram illustrating a configuration example of a driver circuit 11*a*.

FIG. 2 is a diagram illustrating a configuration example of the driver circuit 11*a*. The driver circuit 11*a* supplies the drive current Idrv to the load 13 or stops the drive current Idrv, based on the signal S1. Specifically, the driver circuit 11*a* causes the drive current Idrv to flow through the load 13 when the signal S1 at a high level (for example, a voltage level of 5 V, hereinafter, referred to as high or high level) is outputted.

On the other hand, the driver circuit 11*a* stops the drive current Idrv flowing through the load 13 when the signal S1 at a low level (for example, a voltage level of 0 V, hereinafter, referred to as low or low level) is outputted.

The driver circuit 11*a* includes an NMOS transistor 100, diodes 101, 112, and 170, resistors 110, 111, 113, and 130, detection circuits (DET) 120 and 140, a control circuit (CTRL) 150*a*, and a depression-type NMOS transistor 160.

The NMOS transistor 100 has a gate electrode, a drain electrode, and a source electrode, and controls the drive current Idrv flowing through the load 13, based on a voltage Vg applied to the gate electrode. The gate electrode is electrically coupled to the control terminal G. The drain electrode is coupled to the power supply side terminal D. The source electrode is coupled to the ground side terminal S. In addition, a voltage between the drain electrode and the source electrode of the NMOS transistor 100 is referred to as a voltage Vds. Although the description is given assuming the NMOS transistor in this embodiment, a bipolar transistor may also be used. The NMOS transistor 100 corresponds to a "switching device". The gate electrode corresponds to a "control electrode". The drain electrode corresponds to a "power supply side electrode". The source electrode corresponds to a "ground side electrode".

The diode 101 is a parasitic diode of the NMOS transistor 100.

The resistor 110 is a so-called gate resistor, and is provided between a line L1 coupled to the control terminal G and a line L2 coupled to the gate electrode. In this embodiment, a voltage applied to the line L1 is referred to as a voltage V1.

The resistor 111 is a so-called gate resistor, and is provided between the resistor 110 and the gate electrode. A voltage V2 of the line L2 is applied to one end of the resistor 111. A voltage at a connection point between the resistor 111 and the NMOS transistor 100 is referred to as a voltage Vg. Then, when the high signal S1 is outputted, a parasitic capacitance between the gate and source of the NMOS transistor 100 is charged via the resistors 110 and 111.

The diode 112 is an element through which current flows to turn off the NMOS transistor 100, and is provided in parallel with the resistor 110 together with the resistor 113. Specifically, when the low signal S1 is outputted, the diode 112 discharges the parasitic capacitance between the gate and source of the NMOS transistor 100 through the resistor 111 together with the resistor 110, in order to turn off the NMOS transistor 100 by applying the ground level voltage Vg.

Note that depending on the resistance values of the resistors 110, 111, and 113, the rate of change of the voltage Vg per unit time can be set separately when turning on or off the NMOS transistor 100.

===Detection Circuit 120===

The detection circuit 120 detects the drive current Idrv flowing between the drain electrode and the source electrode of the NMOS transistor 100. Specifically, when the NMOS transistor 100 is turned on, the detection circuit 120 detects the drive current Idrv based on the voltage level of the voltage Vds, which is determined according to the product of an on-resistance of the NMOS transistor 100 and the drive current Idrv.

The detection circuit 120 is a voltage divider circuit including resistors 121 and 122. Upon application of the voltage Vds thereto, the detection circuit 120 generates a voltage Vx corresponding to the voltage Vds at a connection point between the resistors 121 and 122. Note that the resistance values of the resistors 121 and 122 are set such that the voltage Vx reaches a voltage that turns on an NMOS transistor 154 (described later) when the NMOS transistor 100 is turned on, causing an inrush current to flow from the load 13 (for example, a motor), for example, and the voltage level of the voltage Vds exceeds a predetermined level. In this embodiment, it is assumed that when the voltage Vx reaches the voltage that turns on the NMOS transistor 154, the current value of the drive current Idrv exceeds a predetermined value, resulting in a state where the drive current Idrv is an overcurrent. Note that the detection circuit 120 corresponds to a "current detection circuit".

The resistor 130 limits the current supplied to a circuit (for example, an inverter circuit 152 (described later)) that operates with a voltage Va of a line La as a power supply voltage. The resistor 130 has one end coupled to the line L1 and the other end coupled to the line La. When a large amount of current flows through the resistor 130, the voltage Va drops and stops the operation of the circuit (for example, the inverter circuit 152).

===Detection Circuit 140===

The detection circuit 140 detects a temperature T of the driver circuit 11*a* and generates a voltage indicating the temperature T. The detection circuit 140 includes a depression-type NMOS transistor 141 and diodes D1*a* to D6*a*.

The NMOS transistor 141 operates as a current source and has a gate electrode and a source electrode coupled. The voltage Va is applied to a drain electrode and a current flows from the source electrode to the diodes D1*a* to D6*a*.

The diodes D1*a* to Da are elements that generate the voltage indicating the temperature T of the driver circuit 11*a*. Specifically, the diodes D1*a* to D6*a* generate a voltage Vy at a connection node NO between the diodes D1*a* and D2*a*, and generate a voltage Vz at a connection node N1 between the NMOS transistor 141 and the diode D1*a*.

Figure 3:
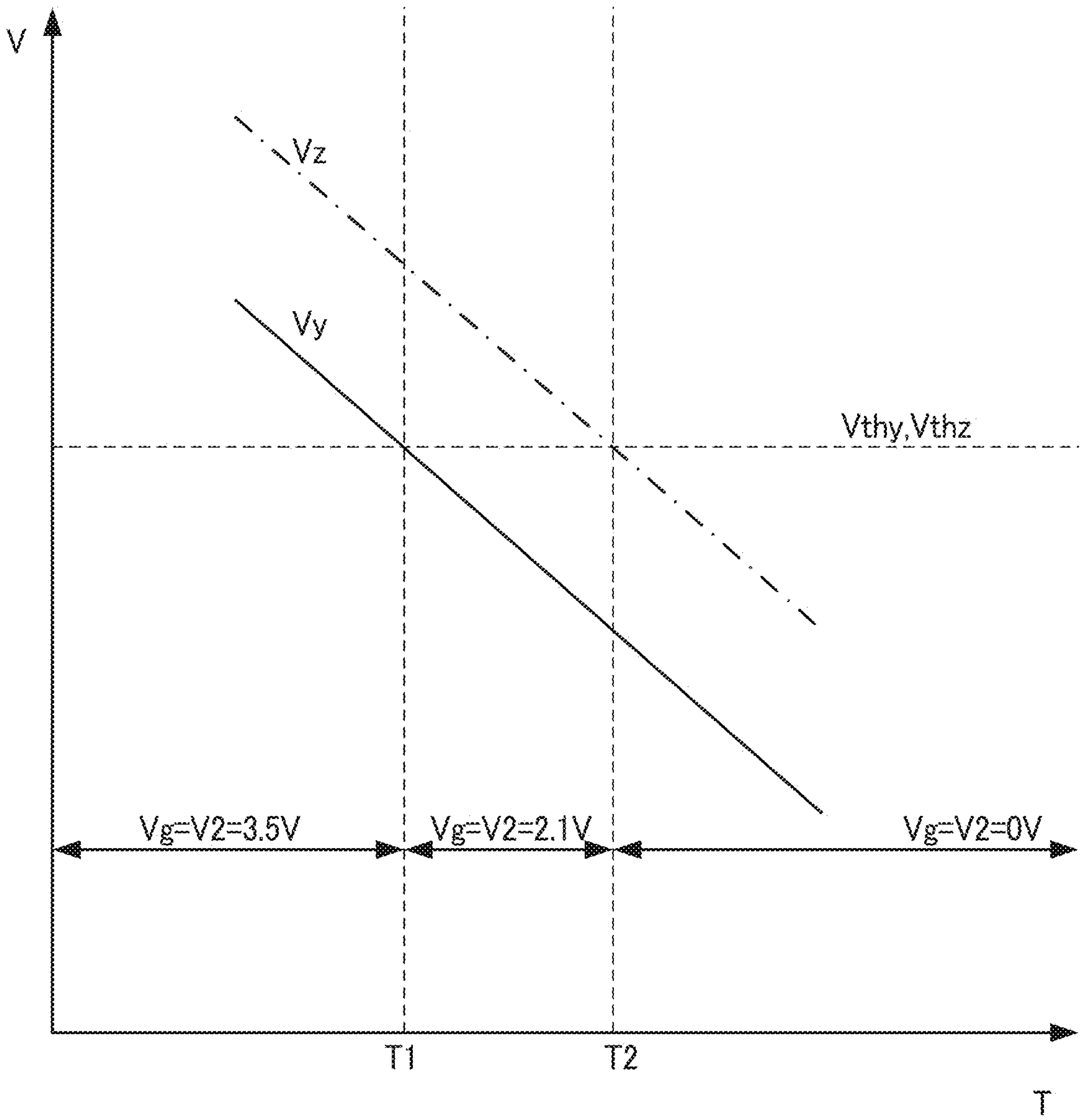
FIG. 3 is a diagram illustrating an example of the relationship among a temperature T, voltages Vy and Vz, and a voltage V2.

Note that the voltages Vy and Vz drop as illustrated in FIG. 3 as the temperature T rises. FIG. 3 illustrates a case where the current value of the drive current Idrv is higher than a predetermined value, and the voltage Vy is indicated by a solid line while the voltage Vz is indicated by a dashed-dotted line. The detection circuit 140 corresponds to a "temperature detection circuit". The NMOS transistor 141 corresponds to a "current source". The diodes D1*a* to D6*a* correspond to "k diodes". The node NO corresponds to a "first node" and the node N1 corresponds to a "second node".

===Control Circuit 150*a*===

The control circuit 150*a* controls the voltage V2 of the line L2 based on the drive current Idrv and the temperature T. Specifically, the control circuit 150*a* sets the voltage level of the voltage Vg to 3.5 V so that when the current value of the drive current Idrv exceeds a predetermined value, the current value decreases while the drive current Idrv flows. Here, 3.5 V corresponds to a forward voltage generated in diodes D1*b* to D5*b* (described later), and corresponds to a "first level".

On the other hand, when the temperature T exceeds a temperature T1 while the current value of the drive current Idrv exceeds the predetermined value, the control circuit 150*a* changes the voltage level of the voltage Vg from 3.5 V to 2.1 V through the line L2, so that the drive current Idrv continues to flow and the current value further decreases. Here, 2.1 V corresponds to a forward voltage generated in the diodes D1*b* to D3*b* (described later), and corresponds to a "second level".

When the temperature T exceeds a temperature T2, the control circuit 150*a* sets the voltage level of the voltage V2 to 0 V and sets the voltage Vg to 0 V, in order to stop the drive current Idrv.

The control circuit 150*a* includes a switch control circuit (SWCT) 151*a*, NMOS transistors 154 to 156, and the diodes Db to D5*b*.

The switch control circuit 151*a* controls on and off of the NMOS transistors 155 and 156. Specifically, the switch control circuit 151*a* turns on the NMOS transistor 155 when the temperature T exceeds the temperature T1, and turns on the NMOS transistor 156 when the temperature T exceeds the temperature T2 higher than the temperature T1.

The switch control circuit 151*a* includes inverter circuits 152 and 153. The inverter circuit 152 turns on or off the NMOS transistor 155. Specifically, when the temperature T exceeds the temperature T1 and the voltage Vy drops below a threshold voltage Vthy as illustrated in FIG. 3, the inverter circuit 152 determines that the temperature T is above the temperature T1 and turns on the NMOS transistor 155.

On the other hand, when the temperature T drops below the temperature T1 and the voltage Vy exceeds the threshold voltage Vthy, the inverter circuit 152 determines that the temperature T is below the temperature T1 and turns off the NMOS transistor 155. The inverter circuit 152 also operates with the voltage Va as the power supply voltage, and turns off the NMOS transistor 155 when the low signal S1 is inputted to the control terminal G of the driver circuit 11*a*.

The inverter circuit 153 turns on or off the NMOS transistor 156. Specifically, when the temperature T exceeds the temperature T2 and the voltage Vz drops below a threshold voltage Vthz as illustrated in FIG. 3, the inverter circuit 153 determines that the temperature T is above the temperature T2 and turns on the NMOS transistor 156.

On the other hand, when the temperature T drops below the temperature T2 and the voltage Vz exceeds the threshold voltage Vthz, the inverter circuit 153 determines that the temperature T is below the temperature T2 and turns off the NMOS transistor 156. The inverter circuit 153 also operates with the voltage Va as the power supply voltage, and turns off the NMOS transistor 156 when the low signal S1 is inputted to the control terminal of the driver circuit 11*a*.

Although FIG. 3 illustrates a case where the threshold voltages Vthy and Vthz are the same voltage, the threshold voltages Vthy and Vthz may also be different threshold voltages that maintain the relationship T1<T2. The inverter circuits 152 and 153 are used in this embodiment to determine the temperature T, but in this case, a comparator may be used instead of the inverter circuits 152 and 153.

In a case of using a comparator, it may be determined whether the temperature T has reached the temperature T1 or T2 by comparing the voltage level of the voltage Vz with the two threshold voltages Vthy and Vthz, instead of using the voltages Vy and Vz. The threshold voltage Vthy corresponds to a "third level" and the threshold voltage Vthz corresponds to a "fourth level".

The NMOS transistor 154 is an element that is turned on when the drive current Idrv exceeds the predetermined value, and controls the voltage V2 of the line L2 using the diodes D1*b* to D5*b*. The NMOS transistor 154 is provided between the diodes D1*b* to D5*b* and the source electrode of the NMOS transistor 100. Specifically, the NMOS transistor 154 is turned on when the voltage Vx generated by the detection circuit 120 exceeds the threshold voltage Vthx of the NMOS transistor 154. In this event, the NMOS transistor 154 detects the drive current Idrv as an overcurrent.

Note that a voltage division ratio of the resistors 121 and 122 of the detection circuit 120 is set such that when the voltage level of the voltage Vds exceeds a predetermined level, the voltage Vx exceeds the threshold voltage Vthx and the NMOS transistor 154 is turned on. As a result, when the voltage level of the voltage Vds exceeds a predetermined level and the current value of the drive current Idrv exceeds a predetermined value, the voltage level of the voltage V2 reaches 3.5 V, for example, and the voltage level of the voltage Vg also reaches 3.5 V, as illustrated in FIG. 3. The NMOS transistor 154 corresponds to a "first switch".

The NMOS transistor 155 is an element that detects whether the temperature T is higher than the temperature T1, and is coupled in parallel with the diodes D4*b* and D5*b*. Specifically, the NMOS transistor 155 is turned on when the temperature T exceeds the temperature T1. As a result, when the temperature T exceeds the temperature T1 with the current value of the drive current Idrv exceeding the predetermined value, the voltage level of the voltage V2 reaches 2.1 V, for example, and the voltage level of the voltage Vg drops from 3.5 V to 2.1 V, as illustrated in FIG. 3. Note that the NMOS transistor 155 corresponds to a "second switch".

The NMOS transistor 156 is an element that detects whether the temperature T is higher than the temperature T2, and is provided between the line L2 and the source electrode. Specifically, when the temperature T exceeds the temperature T2, the NMOS transistor 156 is turned on and sets the voltage Vg to 0 V through the line L2. The NMOS transistor 156 then turns off the NMOS transistor 100 to stop the drive current Idrv. The NMOS transistor 156 corresponds to a "third switch".

The diodes D1*b* to D5*b* control the voltage V2 of the line L2 based on the drive current Idrv and the temperature T, and are coupled in series to the line L2. Specifically, when the current value of the drive current Idrv exceeds a predetermined value, the diodes D1*b* to D5*b* set the voltage level of the voltage V2 of the line L2 to a voltage (for example, 3.5 V) that is the sum of the forward voltages of the diodes D1*b* to D5*b*. In this event, the voltage level of the voltage Vg is 3.5 V.

When the temperature T exceeds the temperature T1 with the current value of the drive current Idrv exceeding the predetermined value, the diodes D1*b* to D5*b* set the voltage V2 of the line L2 to a voltage (for example, 2.1 V) that is the sum of the forward voltages of the diodes D1*b* to D3*b*. In this event, the voltage level of the voltage Vg is 2.1 V.

As described above, when the current value of the drive current Idrv exceeds the predetermined value, the voltage Vg is set to 3.5 V, and the voltage level of the voltage Vg is lowered from 3.5 V to 2.1 V as the temperature T exceeds the temperature T1. The current value of the drive current Idrv can thus be lowered.

Thus, a further rise in temperature T can be suppressed. This prevents the temperature T from exceeding the temperature T2. As a result, the NMOS transistor 100 is prevented from being repeatedly turned on and off in an overheated state due to a rise or drop in temperature T around the temperature T2. The five diodes D1*b* to D5*b* correspond to "n diodes". The temperature T1 corresponds to a "first temperature" and the temperature T2 corresponds to a "second temperature". In this embodiment, the number of the diodes D1*b* to D5*b* coupled in series is five, but the number thereof is not limited thereto.

The NMOS transistor 160 causes a current to flow from the line L2 to the source electrode of the NMOS transistor 100. Specifically, the NMOS transistor 160 is a depression-type NMOS transistor, which has a gate electrode and a source electrode coupled and is provided between the line L2 and the source electrode of the NMOS transistor 100.

The NMOS transistor 160 causing a current to flow prevents the NMOS transistor 100 from being turned on by mistake when no voltage is applied to the control terminal G and the control terminal G is released.

The diode 170 is an element that protects the control terminal G, and has an anode coupled to the source electrode of the NMOS transistor 100 and a cathode coupled to the control terminal G.

<<<Operation of Driver Circuit 11*a*>>>

Figure 4:
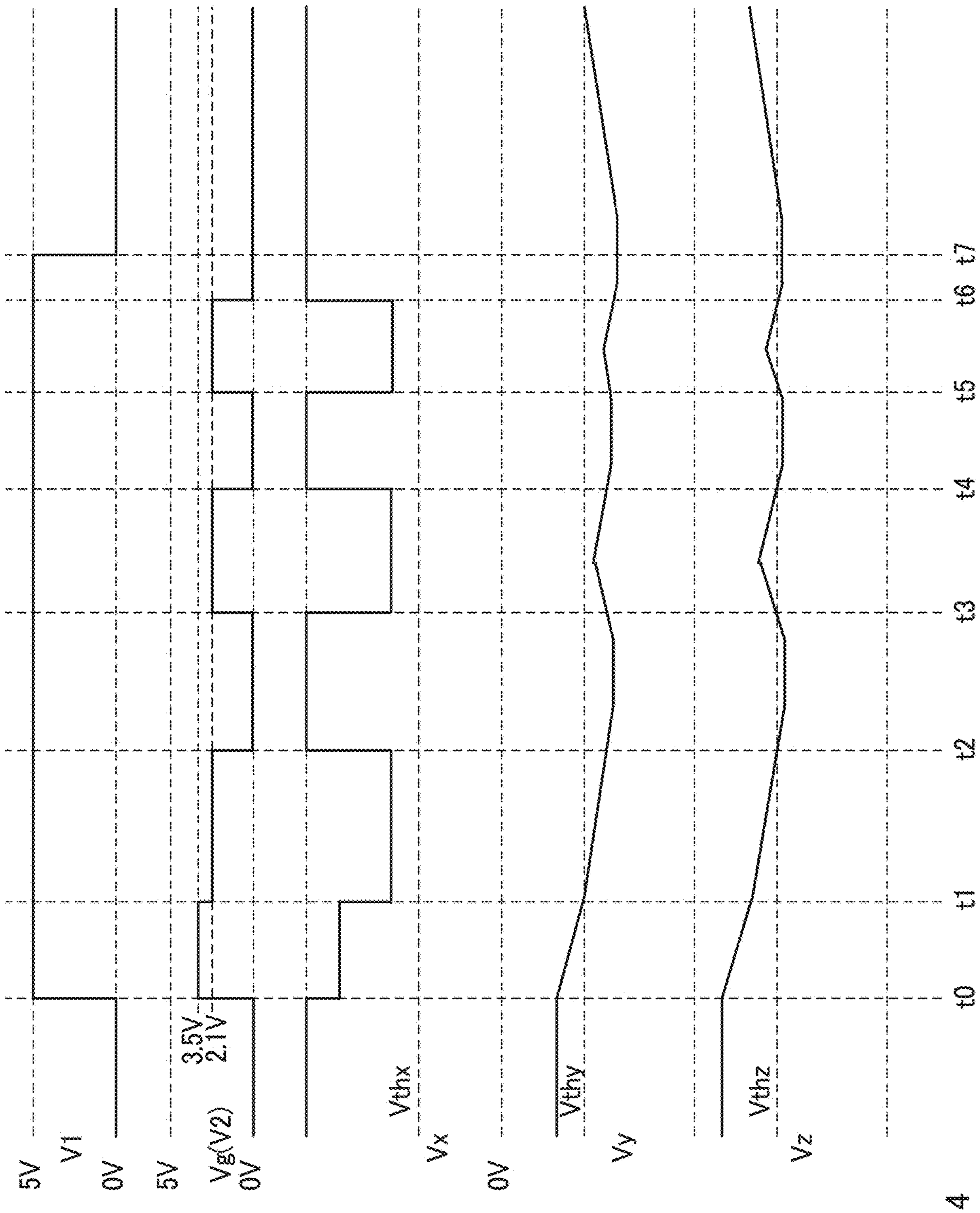
FIG. 4 is a diagram illustrating an operation example of the driver circuit 11*a*.

FIG. 4 is a diagram illustrating an example that the driver circuit 11*a* operates. When the high signal S1 is outputted at time to, the NMOS transistor 100 is turned on. Then, when the current value of the drive current Idrv exceeds a predetermined value and the voltage Vx corresponding to the voltage Vds exceeds the threshold value Vthx, the NMOS transistor 154 is turned on, and the diodes D1*b* to D5*b* set the voltage level of the voltage V2 to 3.5 V. The voltage level of the voltage Vg also reaches 3.5 V.

As a result, the current value of the drive current Idrv decreases, and the voltage Vx decreases as the voltage Vds decreases. However, the voltage Vx is still higher than the threshold voltage Vthx, and the current value of the drive current Idrv exceeds the predetermined value, resulting in an overcurrent state.

At time t1, when the temperature T rises with the drive current Idrv in the overcurrent state and exceeds the temperature T1, the voltage Vy drops below the threshold voltage Vthy. Then, the inverter circuit 152 outputs a high signal to turn on the NMOS transistor 155, and the diodes D1*b* to D5*b* set the voltage level of the voltage V2 to 2.1 V. The voltage level of the voltage Vg then drops from 3.5 V to 2.1 V.

As a result, the current value of the drive current Idrv further decreases and the voltage Vx decreases. However, the voltage Vx is still higher than the threshold voltage Vthx and the current value of the drive current Idrv exceeds the predetermined value, resulting in the overcurrent state of the drive current Idrv.

However, the current value of the drive current Idrv is lower than the value at time to, thus suppressing a rise in temperature T. Therefore, after time t1, the temperature T is prevented from exceeding the temperature T2, but in order to explain the operation of the driver circuit 11*a*, the following description is given assuming that the temperature T exceeds the temperature T2.

At time t2, when the temperature T exceeds the temperature T2, the inverter circuit 153 outputs a high signal to turn on the NMOS transistor 156. As the NMOS transistor 156 is turned on, the voltage level of the voltage V2 becomes 0 V and the voltage level of the voltage Vg also becomes 0 V.

As a result, by turning off the NMOS transistor 100, the drive current Idrv is stopped and the voltage Vds becomes the power supply voltage Vcc. The voltage Vx also becomes a voltage corresponding to the power supply voltage Vcc as the NMOS transistor 100 is off.

At time t3, the NMOS transistor 156 is turned off as the temperature T drops below the temperature T2 due to the influence of the ambient temperature of the driver circuit 11*a*, for example. Even if the NMOS transistor 156 is turned off, when the current value of the drive current Idrv exceeds the predetermined value and the temperature T exceeds the temperature T1, the voltage level of the voltage V2 becomes 2.1 V and the voltage level of the voltage Vg also becomes 2.1 V. The same operation continues after time t3.

Then, at time t7, the low signal S1 is outputted to turn off the NMOS transistor 100. As the NMOS transistor 100 is turned off, the voltage Vx becomes a voltage corresponding to the power supply voltage Vcc.

In FIG. 4, the description is given to the case where the current value of the drive current Idrv exceeds the predetermined value, resulting in the overcurrent state. However, when the drive current Idrv is not in the overcurrent state, the NMOS transistor 154 is off. Therefore, the voltage V2 of the line L2 is not controlled by the control circuit 150*a*.

Therefore, when the high signal S1 is outputted to the control terminal G, the voltage level of the voltage Vg becomes 5 V, for example, and the NMOS transistor 100 is turned on. On the other hand, when the low signal S1 is outputted to the control terminal G, the voltage level of the voltage Vg becomes 0 V and the NMOS transistor 100 is turned off.

With the high signal S1 outputted to the control terminal G, when the temperature T drops after reaching the temperature T1 and the current value of the drive current Idrv exceeds the predetermined value, the control circuit 150*a* sets the voltage level of the voltage V2 of the line L2 to 3.5 V. Similarly, no matter what voltage level the voltage V2 is at, the voltage level of the voltage V2 becomes 5 V as the current value of the drive current Idrv drops below the predetermined value.

===Modification===

<<<Configuration of Driver Circuit 11*b*>>>

Figure 5:
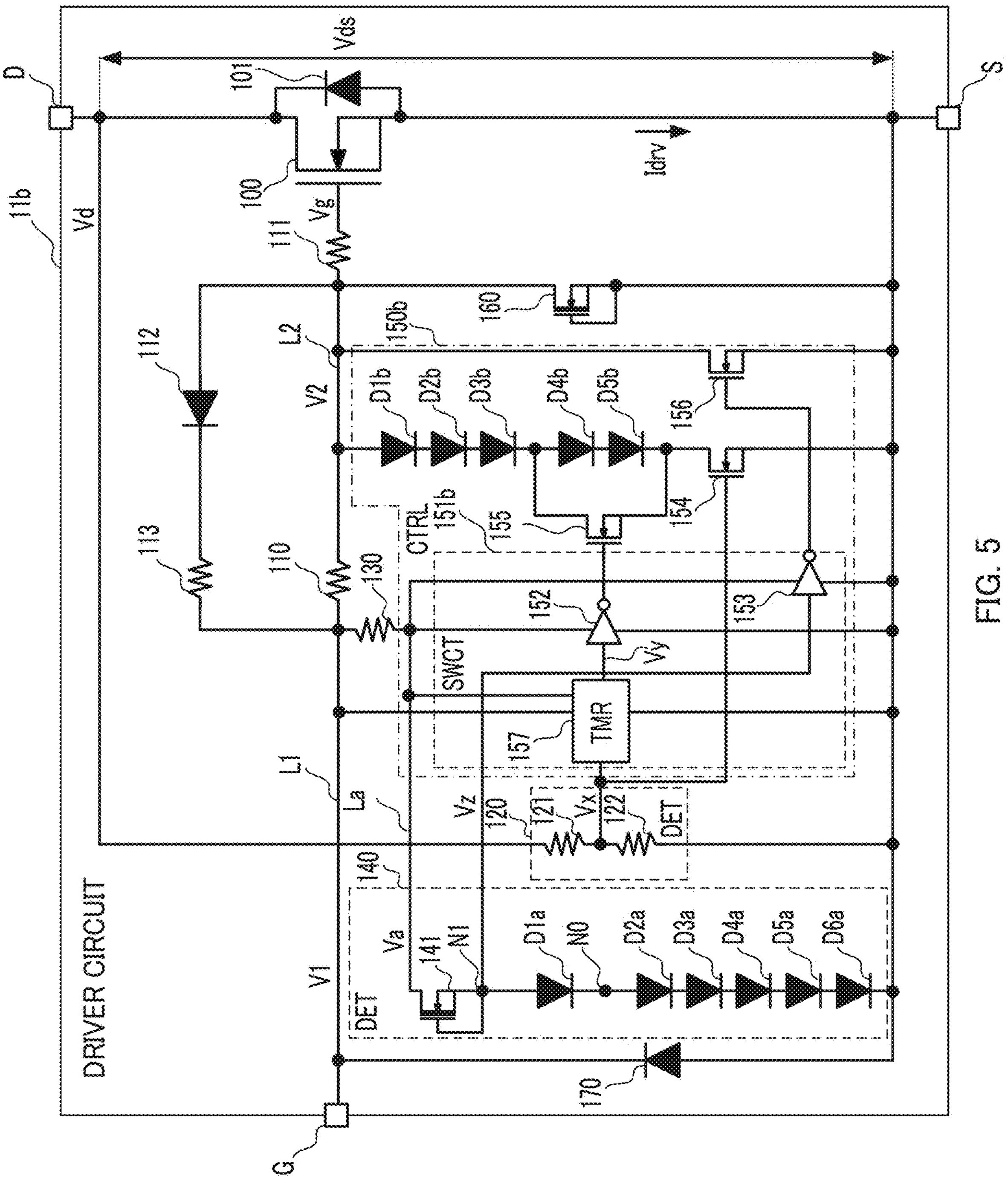
FIG. 5 is a diagram illustrating a configuration example of a driver circuit 11*b*.

FIG. 5 is a diagram illustrating a configuration example of a driver circuit 11*b*. The driver circuit 11*b* differs from the driver circuit 11*a* in turning on the NMOS transistor 155 based on the voltage Vx.

The driver circuit 11*b* includes an NMOS transistor 100, diodes 101, 112, and 170, resistors 110, 111, 113, and 130, detection circuits 120 and 140, a control circuit 150*b*, and a depression-type NMOS transistor 160.

The control circuit 150*b* controls a voltage level of a voltage V2 of a line L2 based on a drive current Idrv and a temperature T. Specifically, when a current value of the drive current Idrv exceeds a predetermined value, the control circuit 150*b* lowers the voltage level of the voltage V2 and sets a voltage level of a voltage Vg to 3.5 V, so that the drive current Idrv continues to flow but the current value thereof decreases.

On the other hand, when a predetermined period P elapses with the current value of the drive current Idrv exceeding the predetermined value, the control circuit 150*b* lowers the voltage level of the voltage V2 and lowers the voltage level of the voltage Vg from 3.5 V to 2.1 V, so that the drive current Idrv continues to flow but the current value thereof further decreases.

Then, when the temperature T exceeds a temperature T2, the control circuit 150*b* sets the voltage level of the voltage V2 to 0 V and the voltage level of the voltage Vg to 0 V, in order to stop the drive current Idrv.

The control circuit 150*b* includes a switch control circuit 151*b*, NMOS transistors 154 to 156, and diodes D1*b* to D5*b*.

The switch control circuit 151*b* turns on the NMOS transistor 155 when a period during which the current value of the drive current Idrv exceeds the predetermined value reaches the predetermined period P. The switch control circuit 151*b* includes inverter circuits 152 and 153 and a timer 157.

Figure 6:
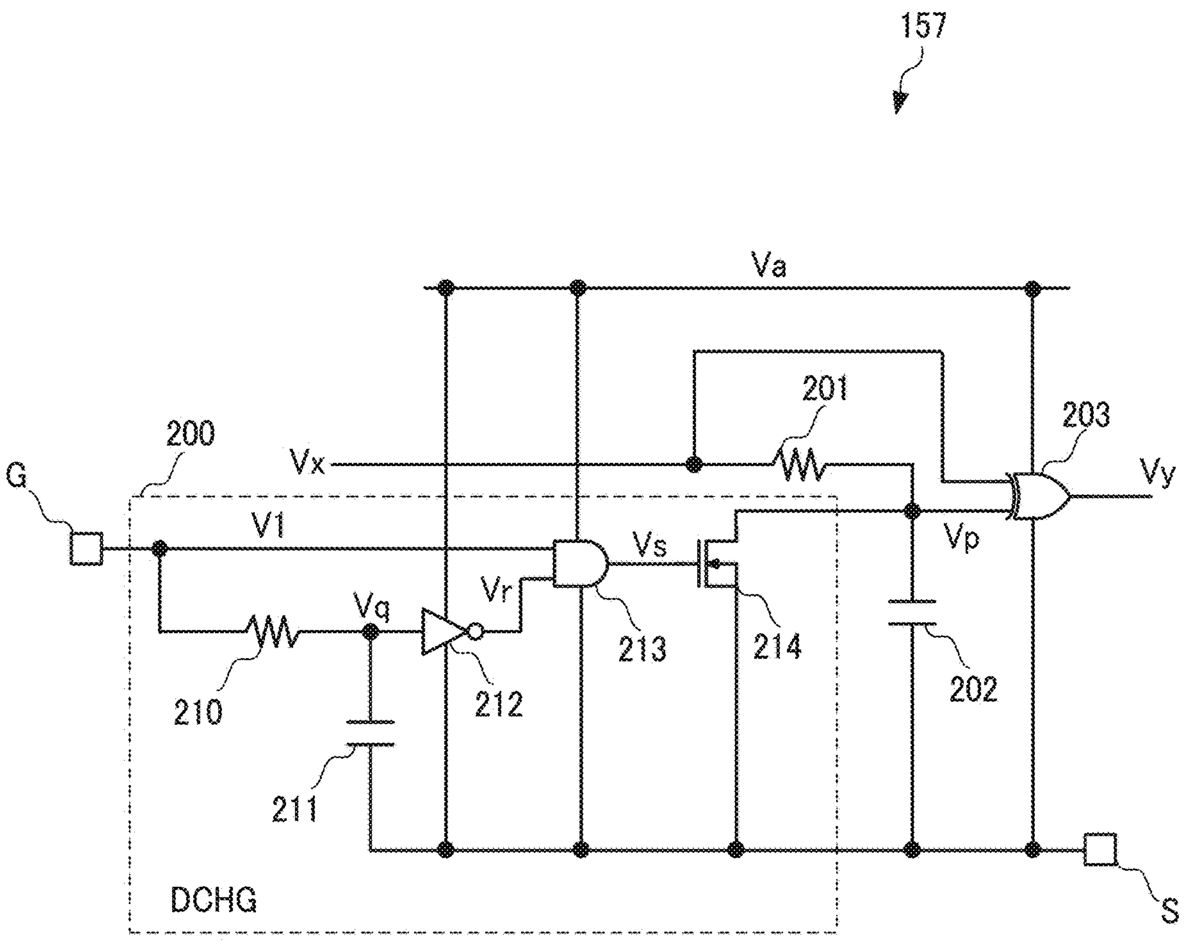
FIG. 6 is a diagram illustrating a configuration example of a timer 157.

FIG. 6 is a diagram illustrating a configuration example of the timer 157. The timer (TMR) 157 outputs a voltage Vy to the inverter circuit 152 based on the voltage Vx. Specifically, when a high signal S1 is outputted, the timer 157 outputs the voltage Vy to turn on the NMOS transistor 155 as the period during which the current value of the drive current Idrv exceeds the predetermined value reaches the predetermined period P.

The timer 157 includes a discharge circuit (DCHG) 200, a resistor 201, a capacitor 202, and an exclusive OR circuit 203.

When the high signal S1 is outputted, the discharge circuit 200 discharges the capacitor 202 during a reset period Prst. The discharge circuit 200 includes a resistor 210, a capacitor 211, an inverter circuit 212, an AND circuit 213, and an NMOS transistor 214.

When the high signal S1 is outputted, a current flows through the resistor 210 to charge the capacitor 211.

The capacitor 211 is charged through the resistor 210 as the high signal S1 is outputted. When a low signal S1 is outputted, on the other hand, the capacitor 211 is discharged through the resistor 210. Note that a voltage generated by the capacitor 211 is referred to as the voltage Vq.

When the voltage Vq exceeds a threshold voltage of the inverter circuit 212 after the elapse of the reset period Prst from the output of the high signal S1, the inverter circuit 212 outputs a voltage Vr, which is a ground voltage. On the other hand, when the voltage Vq is lower than the threshold voltage of the inverter circuit 212, the inverter circuit 212 outputs the voltage Vr, which is the voltage Va.

When the high signal S1 is outputted, the AND circuit 213 outputs a voltage Vs, which is the voltage Va, based on a voltage V1 of 5 V and the voltage Vr, which is the voltage Va, to turn on the NMOS transistor 214, for example.

On the other hand, the AND circuit 213 turns off the NMOS transistor 214 when the low signal S1 is outputted, or when the inverter circuit 212 outputs the voltage Vr, which is the ground voltage, after the elapse of the reset period Prst.

Therefore, the NMOS transistor 214 is turned on and the capacitor 202 is discharged until the reset period Prst elapses after the high signal S1 is outputted. On the other hand, when the reset period Prst elapses after the high signal S1 is outputted, the NMOS transistor 214 is turned off and the capacitor 202 is charged through the resistor 201. The resistor 201 corresponds to a “charge circuit”.

The voltage Vp generated by the capacitor 202 exceeds a threshold voltage Vthp when a charging period Pchg elapses after the start of charging the capacitor 202 through the resistor 201. On the other hand, the voltage Vp is less than the threshold voltage Vthp until the charging period Pchg elapses. The reset period Prst corresponds to a “first period” and the charging period Pchg corresponds to a “second period”.

The exclusive OR circuit 203 outputs the voltage Vy based on the voltage Vp generated by the capacitor 202 and the voltage Vx. Specifically, the exclusive OR circuit 203 outputs the voltage Vy, which is the voltage Va, to turn off the NMOS transistor 155 as long as the voltage Vp does not exceed the threshold voltage Vthp even if the current value of the drive current Idrv exceeds the predetermined value.

On the other hand, when the low signal S1 is outputted or when the voltage Vp exceeds the threshold voltage Vthp with the current value of the drive current Idrv exceeding the predetermined value, the exclusive OR circuit 203 outputs the voltage Vy, which is the ground voltage. The exclusive OR circuit 203 also outputs the voltage Vy, which is the ground voltage, when the current value of the drive current Idrv is lower than the predetermined value. The NMOS transistor 155 is thus turned on.

More specifically, the exclusive OR circuit 203 outputs the voltage Vy, which is the voltage Va, when the voltage Vx is higher than the threshold voltage Vthx and the voltage Vp is lower than the threshold voltage Vthp, or when the voltage Vx is lower than the threshold voltage Vthx and the voltage Vp is higher than the threshold voltage Vthp. The NMOS transistor 155 is thus turned off.

The exclusive OR circuit 203 outputs the voltage Vy, which is the ground voltage, when the voltage Vx is higher than the threshold voltage Vthx and the voltage Vp is higher than the threshold voltage Vthp, or when the voltage Vx is lower than the threshold voltage Vthx and the voltage Vp is lower than the threshold voltage Vthp. The NMOS transistor 155 is thus turned on. The exclusive OR circuit 203 corresponds to an “ON circuit”.

When the low signal S1 is outputted, the drive current Idrv is stopped and the NMOS transistor 154 is turned off. Therefore, even if the NMOS transistor 155 is turned on, it does not affect the voltage level of the voltage V2 of the line L2. Similarly, when the current value of the drive current Idrv is lower than the predetermined value, the NMOS transistor 154 is turned off. Therefore, the diodes D1*b* to D5*b* do not affect the voltage V2 of the line L2, causing no problem even if the NMOS transistor 155 is turned on.

From the above operation, the timer 157 turns on the NMOS transistor 155 when a period during which the current value of the drive current Idrv exceeds the predetermined value reaches a predetermined period P after the high signal S1 is outputted.

The reason for this operation is that when the NMOS transistors 154 and 155 are turned on immediately after the high signal S1 is outputted, the voltage V2 of the line L2 may become 2.1 V close to the threshold voltage (for example, 2.0 V) of the NMOS transistor 100. In this case, there is a possibility of the NMOS transistor 100 not being turned on.

On the other hand, the timer 157 turns off the NMOS transistor 155 until the reset period Prst elapses. This prevents the phenomenon that the NMOS transistor 100 is not turned on even if the NMOS transistor 154 is turned on immediately after the high signal S1 is outputted.

This is because even if the NMOS transistor 154 is turned on, the voltage level of the voltage V2 is 3.5 V, which is sufficiently higher than the threshold voltage 2.0 V of the NMOS transistor 100.

When the predetermined period P elapses after the high signal S1 is outputted with the current value of the drive current Idrv exceeding the predetermined value, the control circuit 150*b* lowers the voltage level of the voltage Vg from 3.5 V to 2.1 V. The predetermined period P includes the reset period Prst and the charging period Pchg.

The driver circuit 11*b* can thus prevent the temperature T from exceeding the temperature T2 by lowering the current value of the drive current Idrv in two steps. The driver circuit 11*b* can thus prevent the NMOS transistor 100 from being continuously turned on and off around the temperature T2. This can reduce the load on the NMOS transistor 100.

<<<Operation of Driver Circuit 11*b*>>>

Figure 7:
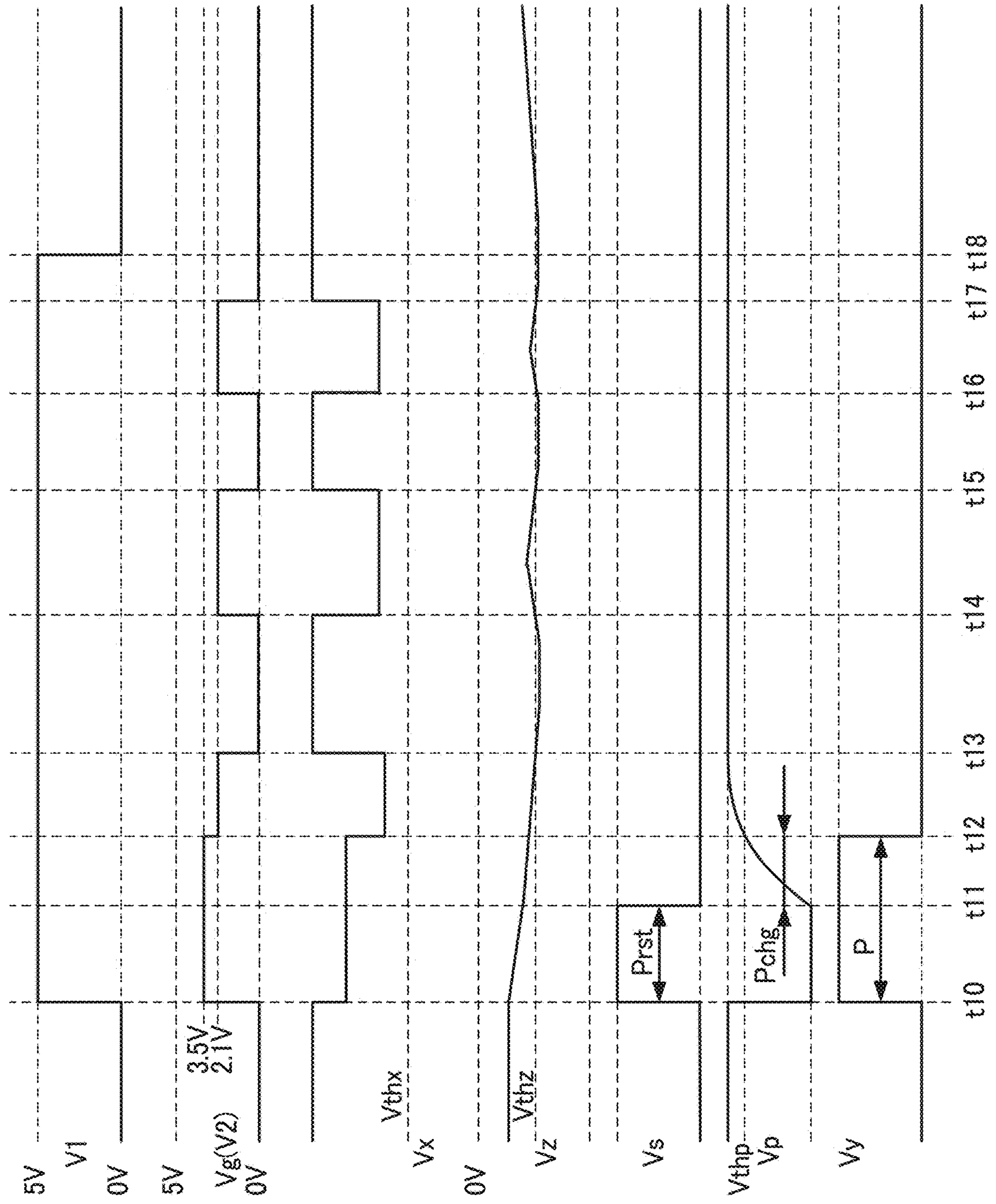
FIG. 7 is a diagram illustrating an example that a driver circuit 11*b* operates.

FIG. 7 is a diagram illustrating an operation example of the driver circuit 11*b*. In FIG. 7, times t13 to t18 correspond to times t2 to t7 in FIG. 4, respectively.

At time t10, when the high signal S1 is outputted, the NMOS transistor 100 is turned on. Then, when the current value of the drive current Idrv exceeds the predetermined value and the voltage Vx corresponding to the voltage Vds exceeds the threshold value Vthx, the NMOS transistor 154 is turned on, and the diodes D1b to D5b set the voltage level of the voltage V2 to 3.5 V. The voltage level of the voltage Vg also becomes 3.5 V.

In this event, the capacitor 211 of the timer 157 is not yet charged, and thus the voltage Vq is low, and the inverter circuit 212 outputs the voltage Vr, which is the voltage Va. The AND circuit 213 then turns on the NMOS transistor 214 based on the voltage V1 and the voltage Vr.

When the NMOS transistor 214 is turned on, the capacitor 202 is discharged. Therefore, the voltage Vp remains low even if the current value of the drive current Idrv exceeds the predetermined value. Therefore, the exclusive OR circuit 203 outputs the voltage Vy, which is the voltage Va, to turn off the NMOS transistor 155.

As a result, the voltage level of the voltage V2 of the line L2 remains as low as 3.5 V.

At time t11 when the reset period Prst elapses from time t10, when the capacitor 211 is charged and the voltage Vq exceeds the threshold voltage of the inverter circuit 212, the inverter circuit 212 outputs the voltage Vr, which is the ground voltage.

The AND circuit 213 outputs the voltage Vs, which is the ground voltage, based on the voltage V1 of 5 V and the voltage Vr, which is the ground voltage, to turn off the NMOS transistor 214. As the NMOS transistor 214 is turned off, the capacitor 202 starts to be charged with the voltage Vx through the resistor 201, and the voltage Vp starts to rise.

At time t12 when the charging period Pchg elapses from time t11 and the voltage Vp reaches the threshold voltage Vthp, the exclusive OR circuit 203 outputs the voltage Vy, which is the ground voltage, based on the voltage Vx and the voltage Vp to turn on the NMOS transistor 155. As the NMOS transistor 155 is turned on, the control circuit 150b sets the voltage level of the voltage V2 of the line L2 to 2.1 V.

As a result, the current value of the drive current Idrv further decreases and the voltage Vx decreases. However, the voltage Vx is still higher than the threshold voltage Vthx, and the current value of the drive current Idrv exceeds the predetermined value.

However, the current value of the drive current Idrv is lower than at time t10, thus suppressing a rise in temperature T. Therefore, after time t12, the temperature T is prevented from exceeding the temperature T2. This can reduce the load on the NMOS transistor 100.

<<<Configuration of Driver Circuit 11c>>>

Figure 8:
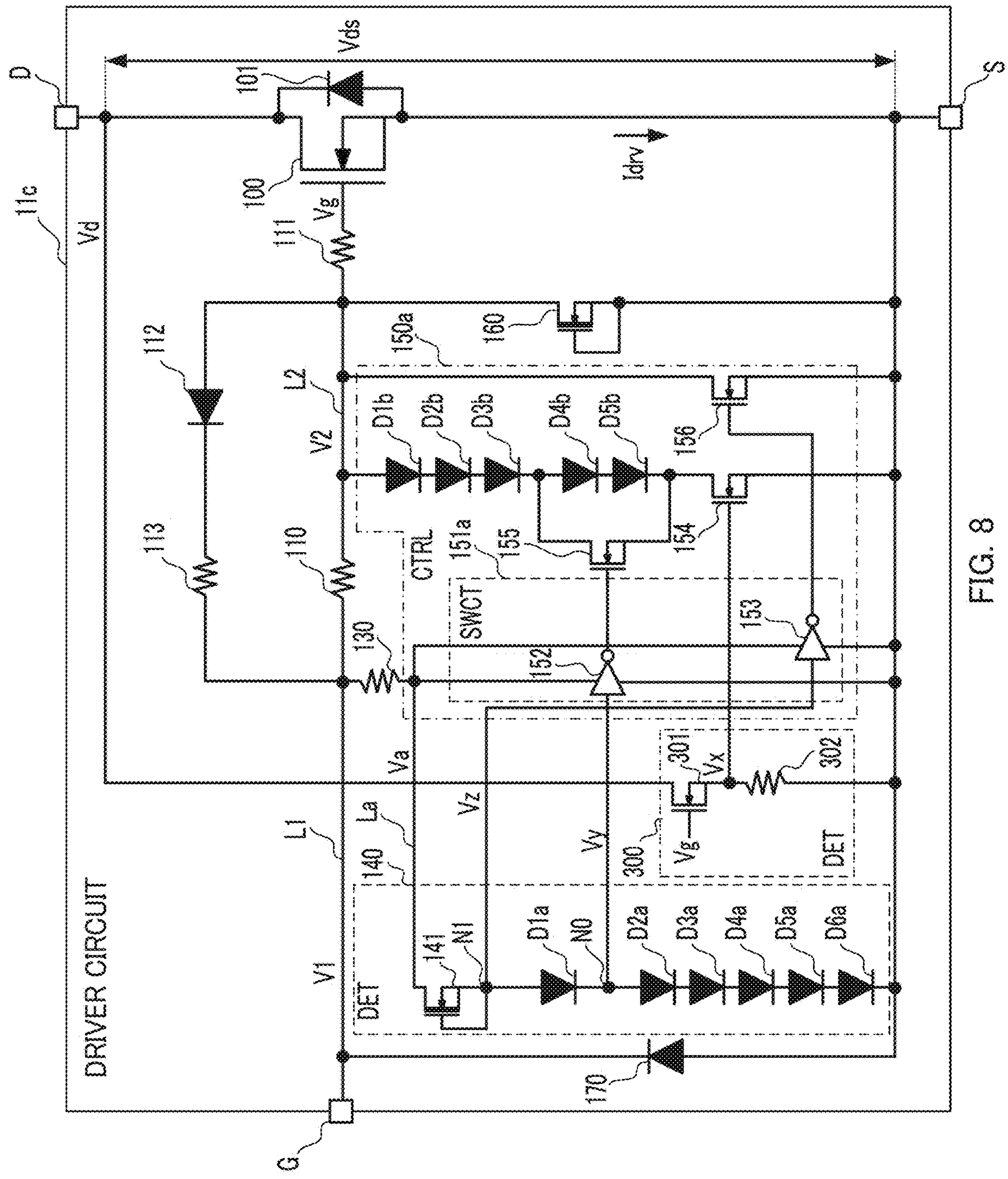
FIG. 8 is a diagram illustrating a configuration example of a driver circuit 11*c*.

FIG. 8 is a diagram illustrating a configuration example of a driver circuit 11c. The driver circuit 11c is obtained by replacing the detection circuit 120 in the driver circuit 11a with a detection circuit (DET) 300.

The detection circuit 300 detects a drive current Idrv and includes an NMOS transistor 301 and a resistor 302. The NMOS transistor 301 is an element through which a current having a current value smaller than a current value of the drive current Idrv flows in accordance with the drive current Idrv flowing through the NMOS transistor 100. The NMOS transistor 301 has a gate electrode, to which a voltage Vg is applied, and has a drain electrode and a source electrode coupled to the drain electrode and source electrode of the NMOS transistor 100, respectively.

The current flowing through the NMOS transistor 301 flows through the resistor 302, and a voltage Vx is generated at a connection node between the NMOS transistor 301 and the resistor 302, based on the flowing current.

When a high signal S1 is outputted, the NMOS transistor 301 is turned on in the same way as the NMOS transistor 100 is turned on. Then, the resistor 302 generates the voltage Vx based on the current flowing through the NMOS transistor 301.

When the voltage level of the voltage V2 of the line L2 is controlled by the control circuit 150a, the voltage Vg changes accordingly, setting the NMOS transistors 100 and 301 in the same operating state, and a current corresponding to the drive current Idrv flowing through the NMOS transistor 100 flows through the NMOS transistor 301.

On the other hand, when a low signal S1 is outputted, the NMOS transistor 301 is turned off in the same way as the NMOS transistor 100 is turned off. Then, since no current flows through the NMOS transistor 301, the resistor 302 generates a voltage Vx, which is the ground voltage.

<<<Configuration of Driver Circuit 11d>>>

Figure 9:
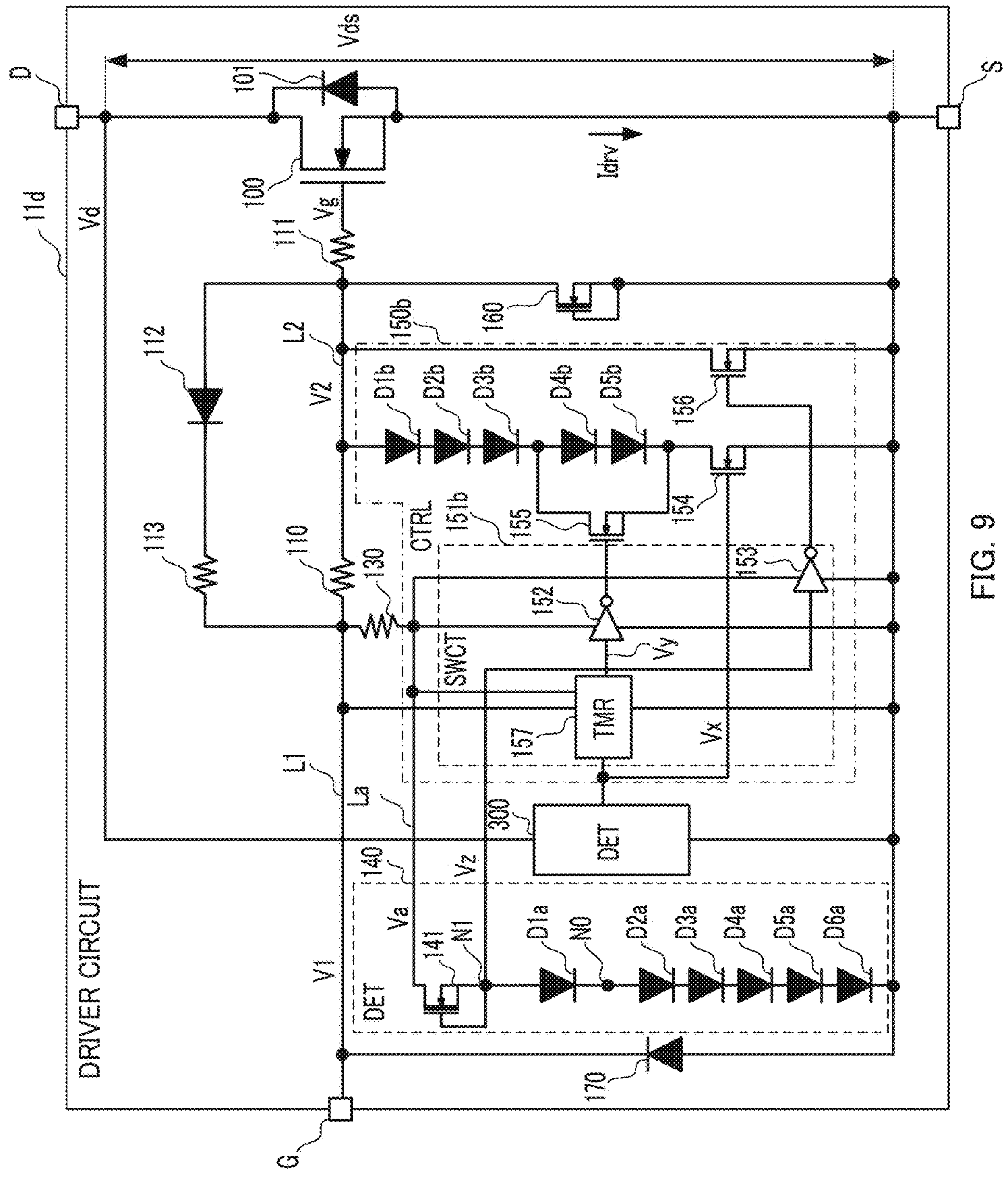
FIG. 9 is a diagram illustrating a configuration example of a driver circuit 11*d*.

FIG. 9 is a diagram illustrating a configuration example of a driver circuit 11d. The driver circuit 11d is obtained by replacing the detection circuit 120 in the driver circuit 11b with a detection circuit 300. The detection circuit 300 operates as described above, and thus description thereof will be omitted.

===Summary===

The motor control apparatus 10 according to this embodiment has been described above. The driver circuit 11a includes the NMOS transistor 100, the detection circuits 120 and 140, and the control circuit 150a. The control circuit 150a controls the voltage level of the voltage Vg to any one of 5 V, 3.5 V, and 2.1 V based on the drive current Idrv and the temperature T. When the current value of the drive current Idrv exceeds a predetermined value, the control circuit 150a first controls the voltage level of the voltage Vg to 3.5 V. Then, when the overcurrent state continues and the temperature T reaches the temperature T1, the control circuit 150a controls the voltage level of the voltage Vg to 2.1 V. When the drive current Idrv becomes an overcurrent, the current value of the drive current Idrv is thus gradually lowered by changing the voltage level of the voltage Vg in steps. Thus, the temperature T is prevented from getting higher than the temperature T1. This makes it possible to provide a driver circuit that can reduce the load on the switching device.

The control circuit 150a includes the diodes D1b to D5b, the NMOS transistors 154 and 155, and the switch control circuit 151a. The control circuit 150a changes the voltage level of the voltage Vg in steps by changing the number of the diodes D1b to D5b coupled in series, and thus gradually lowers the current value of the drive current Idrv. Thus, the drive current Idrv can be easily reduced in steps, and the temperature T can be prevented from reaching the temperature T2.

The control circuit 150a includes the NMOS transistor 156. The switch control circuit 151a turns on the NMOS transistor 156 when the temperature T exceeds the temperature T2. The control circuit 150a turns off the NMOS transistor 100 when the temperature T exceeds the temperature T2. The control circuit 150a thus suppresses a further rise in temperature T and prevents breakdown of the driver circuit 11a.

The detection circuit 140 includes the NMOS transistor 141 and the diodes D1a to D6a. The switch control circuit 151a turns on the NMOS transistor 155 when the voltage level of the node NO (that is, the voltage level of the voltage Vy) reaches the threshold voltage Vthy. The switch control circuit 151a turns on the NMOS transistor 156 when the voltage level of the node N1 (that is, the voltage level of the voltage Vz) reaches the threshold voltage Vthz. This allows the detection circuit 140 to generate the voltages Vy and Vz using the series of diodes D1*a* to D6*a*. The detection circuit 140 can also cause the NMOS transistor 155 to detect that the temperature T has reached the temperature T1 and the NMOS transistor 156 to detect that the temperature T has reached the temperature T2. The driver circuit 11*a* is a semiconductor module having the power supply side terminal D and the ground side terminal S. The driver circuit 11*a* thus operates as a low-side intelligent power switch (IPS).

The driver circuit 11*b* includes the NMOS transistor 100, the detection circuit 120, and the control circuit 150*b*. When the period during which the current value of the drive current Idrv exceeds a predetermined value exceeds a predetermined period, the driver circuit 11*b* can lower the voltage level of the voltage Vg from 3.5 V to 2.1 V to reduce the drive current Idrv. This prevents the temperature T from reaching the temperature T2, making it possible to provide a driver circuit that can reduce the load on the switching device.

The control circuit 150*b* includes the diodes D1*b* to D5*b*, the NMOS transistors 154 and 155, and the switch control circuit 151*b*. This makes it easier to gradually reduce the drive current Idrv, and the temperature T can be prevented from reaching the temperature T2.

The driver circuit 11*b* includes the detection circuit 140, and the control circuit 150*b* includes the NMOS transistor 156. The switch control circuit 151*b* turns on the NMOS transistor 156 when the temperature T exceeds the temperature T2. The control circuit 150*b* thus suppresses a further rise in temperature T and prevents breakdown of the driver circuit 11*b*.

The switch control circuit 151*b* includes the capacitor 202, the discharge circuit 200, the resistor 201, and the exclusive OR circuit 203. The timer 157 turns off the NMOS transistor 155 for the predetermined period P after the high signal S1 is outputted. This can prevent the voltage level of the voltage V2 of the line L2 from becoming 2.1 V by mistake, which hinders the NMOS transistor 100 from being turned on.

The driver circuit 11*b* is a semiconductor module having the power supply side terminal D and the ground side terminal S. The driver circuit 11*b* thus operates as a low-side IPS.

The present disclosure has been made in view of the problems of the related art as described above, and an object thereof is to provide a driver circuit that can reduce the load on the switching device.

According to the present disclosure, it is possible to provide a driver circuit that can reduce the load on the switching device.

An Embodiment of the present disclosure described above is simply to facilitate understanding of the present disclosure and is not in any way to be construed as limiting the present disclosure. The present disclosure may variously be changed or altered without departing from its essential features and encompass equivalents thereof.

What is claimed is:

1. A driver circuit comprising:

a switching device having a control electrode, a power supply side electrode, and a ground side electrode;

a current detection circuit configured to detect a drive current flowing through the switching device;

a temperature detection circuit configured to detect a temperature; and a control circuit configured to set a voltage level of the control electrode to a first level, so that when a current value of the drive current exceeds a predetermined value, the drive current continues to flow but the current value of the drive current decreases, wherein when the temperature exceeds a first temperature while the current value of the drive current exceeds the predetermined value, the control circuit changes the voltage level of the control electrode from the first level to a second level, so that the drive current continues to flow but the current value of the drive current further decreases.

2. The driver circuit according to claim 1, wherein the control circuit includes n (n>1) diodes coupled in series to the control electrode, a first switch provided between the n diodes and the ground side electrode and configured to be turned on when the current value of the drive current exceeds the predetermined value, a second switch coupled in parallel to m (n>m>0) diodes among the n diodes, and a switch control circuit configured to turn on the second switch when the temperature exceeds the first temperature.

3. The driver circuit according to claim 2, wherein the control circuit includes a third switch provided between the control electrode and the ground side electrode, and the switch control circuit turns on the third switch when the temperature exceeds a second temperature higher than the first temperature.

4. The driver circuit according to claim 3, wherein the temperature detection circuit includes a current source and k (k>1) diodes coupled in series between the current source and the ground side electrode, and wherein the switch control circuit turns on the second switch when a voltage level of a predetermined first node among a plurality of nodes of the k diodes reaches a third level, and turns on the third switch when a voltage level of a second node between the current source and the k diodes reaches a fourth level.

5. The driver circuit according to claim 1, wherein the driver circuit is a semiconductor module, and the semiconductor module includes a first terminal coupled to a power supply through a load and a second terminal coupled to ground.

6. A driver circuit comprising:

a switching device having a control electrode, a power supply side electrode, and a ground side electrode;

a current detection circuit configured to detect a drive current flowing through the switching device; and a control circuit configured to set a voltage level of the control electrode to a first level, so that when a current value of the drive current exceeds a predetermined value, the drive current continues to flow but the current value of the drive current decreases, wherein the control circuit changes the voltage level of the control electrode from the first level to a second level so that when a period during which the current value of the drive current exceeds the value predetermined reaches a predetermined period, the drive current continues to flow but the current value of the drive current further decreases.

7. The driver circuit according to claim 6, wherein the control circuit includes n (n>1) diodes coupled in series to the control electrode, a first switch provided between the n diodes and the ground side electrode and configured to be turned on when the current value of the drive current exceeds the predetermined value, a second switch coupled in parallel to m (n>m>0) diodes of the n diodes, and a switch control circuit configured to turn on the second switch when the period during which the current value of the drive current exceeds the predetermined value reaches the predetermined period.

8. The driver circuit according to claim 7, further comprising:

a temperature detection circuit configured to detect a temperature, wherein the control circuit includes a third switch provided between the control electrode and the ground side electrode, and the switch control circuit turns on the third switch when the temperature exceeds a second temperature.

9. The driver circuit according to claim 8, wherein the switch control circuit includes a capacitor, a discharge circuit configured to discharge the capacitor for a first period that is part of the predetermined period, after the switching device is turned on, a charge circuit configured to charge the capacitor after the capacitor is discharged for the first period, and an ON circuit configured to turn on the second switch when the capacitor is charged and a second period that is part of the predetermined period elapses.

10. The driver circuit according to claim 6, wherein the driver circuit is a semiconductor module, and the semiconductor module includes a first terminal coupled to a power supply through a load and a second terminal coupled to ground.

* * * * *